United States Patent [19]

Giebel

[11] 4,388,541
[45] Jun. 14, 1983

[54] CIRCUIT ARRANGEMENT WITH MOS-TRANSISTORS FOR THE RAPID EVALUATION OF THE LOGIC STATE OF A SAMPLING NODE

[75] Inventor: Burkhard Giebel, Munich, Fed. Rep. of Germany

[73] Assignee: Siemens Aktiengesellschaft, Berlin and Munich, Fed. Rep. of Germany

[21] Appl. No.: 171,342

[22] Filed: Jul. 23, 1980

[30] Foreign Application Priority Data

Aug. 10, 1979 [DE] Fed. Rep. of Germany ....... 2932605

[51] Int. Cl.³ ..................... H03K 5/12; H03K 19/094
[52] U.S. Cl. .................................... 307/530; 307/448; 365/204
[58] Field of Search ............... 307/350, 530, 448, 449, 307/475; 330/271; 365/189, 196, 204

[56] References Cited

U.S. PATENT DOCUMENTS 3,932,848  1/1976  Porat ................................... 365/204
4,145,622  3/1979  Hofmann et al. ................... 307/449

FOREIGN PATENT DOCUMENTS 2600713  1/1977  Fed. Rep. of Germany .

Primary Examiner—John Zazworsky
Attorney, Agent, or Firm—Herbert L. Lerner; Laurence A. Greenberg

[57] ABSTRACT

Circuit having MOS-transistors for the rapid evaluation of the logic state of a sampling node, including a circuit input connected to the sampling node, a circuit output, a supply voltage source, an inverter being connected to the circuit input and having an output, a first transistor being connected between the circuit input and the circuit output and having a gate connected to the output of the inverter, a second transistor being connected between the supply voltage source and the circuit output and having a gate connected to the output of the inverter, and a third transistor shunted across the second transistor as a load resistor.

5 Claims, 3 Drawing Figures

CIRCUIT ARRANGEMENT WITH MOS-TRANSISTORS FOR THE RAPID EVALUATION OF THE LOGIC STATE OF A SAMPLING NODE

The invention relates to a circuit arrangement for the rapid evaluation of the logic state of a sampling node, particularly a read amplifier for static semiconductor read-only memories with memory cells which are arranged in rows and columns, which are formed by MOS-storage transistors and in which the storage cells in each column are each connected with their controlled paths (source-drain paths) to an address line (bit line), and in each row with their control electrodes (gates) to a respective further address line (word line).

Through German Published Prosecuted Application DE-AS No. 26 00 713, a circuit arrangement has become known for the rapid charging and discharging of a sampling node. The sampling node can be selectively coupled to memory cells, for sampling the state of the memory cells, in a static memory. This is done with a charging device for charging the sampling node and a sampling amplifier following the sampling node, in which a control device that controls the flow of current and limits voltage jumps at the sampling node, is connected to the sampling node, and a feedback loop is disposed between the output of the sampling amplifier and the control device.

A complete description of such prior art devices will follow hereinbelow where the shortcomings of such devices will become apparent.

It is accordingly an object of the present invention to provide a circuit arrangement with MOS-transistors for the rapid evaluation of the logic state of a sampling node which overcomes the hereinafore-mentioned disadvantages of the heretofore-known devices of this general type, and particularly for a read amplifier improved over read amplifiers of this type, which is distinguished by an increased readout speed while the circuit is simplified; wherein the simplified circuit is less sensitive against parameter differences between the individual transistors or, with the same insensitivity as compared with the herein-described known read amplifier, allows increased readout speed.

With the foregoing and other objects in view there is provided, in accordance with the invention, a circuit having MOS-transistors for the rapid evaluation of the logic state of a sampling node, comprising a circuit input connected to the sampling node, a circuit output, a supply voltage source, an inverter being connected to the circuit input and having an output, a first transistor being connected between the circuit input and the circuit output and having a gate connected to the output of the inverter, a second transistor being connected between the supply voltage source and the circuit output and having a gate connected to the output of the inverter, and a third transistor shunted across the second transistor as a load resistor.

In accordance with another feature of the invention, there is provided a semiconductor read-only memory array with the sampling node selectively connected to single memory cells, as a read amplifier.

In accordance with a further feature of the invention, the inverter includes transistors of the enhancement type, and the first, second and third transistors are of the enhancement type.

In accordance with an added feature of the invention, the inverter is provided with an MOS-transistor of the depletion type connected as a load resistor, and the third transistor is an MOS-transistor of the depletion type.

In accordance with a concomitant feature of the invention, the inverter comprises two series-connected transistors, the output of the inverter being connected between the series-connected transistors.

Other features which are considered as characteristic for the invention are set forth in the appended claims.

Although the invention is illustrated and described herein as embodied in a circuit arrangement with MOS-transistors for the rapid evaluation of the logic state of a sampling node, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
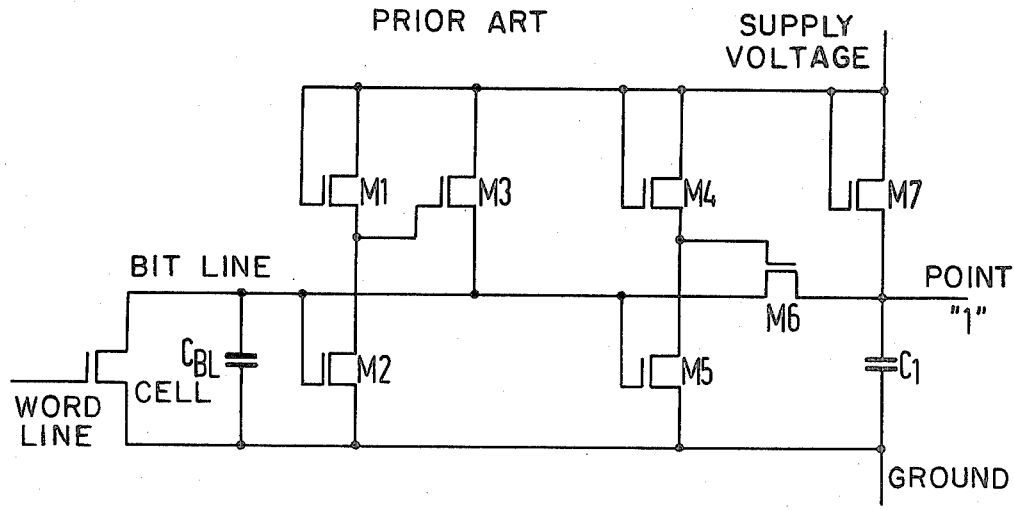
FIG. 1 is a schematic circuit diagram of a prior art read amplifier connected in a memory module.

Referring now to the figures of the drawing and first particularly to FIG. 1 thereof, there is seen a circuit diagram of a read amplifier which is selectively connected in a 16 K-EPROM memory module, Type 2716 manufactured by the firm Intel, to the memory cells. To the left of FIG. 1, as seen in the plane of the drawing, one of the memory cells is indicated and the parasitic bit line capacity is designated with reference characters $C_{BL}$, and the parasitic capacity on the output side of the read amplifier is designated with $C_1$.

This read amplifier represents a current-voltage converter in the operating range of interest. The MOS-transistor M6 in this known arrangement is of the enhancement type as are the other transistors. The transistor M6 cancels the close voltage-wise connection between the bit line BL and the read amplifier output or the point "1" for small input or memory cell current, if the bit line voltage $U_{BL}$ is smaller than the output voltage of the inverter controlled by the bit line voltage $U_{BL}$ with the transistors M4 and M5 by not more than the threshold voltage $U_T$ of the transistor M6. A discharged parasitic bit line capacity $C_{BL}$ is charged up by the current of the transistor M7 and specifically until the effective gate voltage at the transistor M6 becomes so small that this transistor decouples the read amplifier input and output. Then, the transistor M7 only needs to charge the parasitic capacity $C_1$ at the read amplifier output and no longer needs to charge the bit line capacity $C_{BL}$ which is many times larger. This is the advantage of this known circuit over older ones. The final static voltage value of the point "1" is determined here by the bit line current flowing to ground, i.e., in general, the memory cell current, and by the W/L ratio of the transistor M7, i.e. the ratio of channel width to channel length of the transistor due to the geometry, which is a criterion for the conductivity of the MOS-transistor.

The charging current for the parasitic capacities $C_{BL}$ and $C_1$ is always only the difference $I_{M7} - I_{memory\ cells}$ of the currents flowing through the transistors M7 and the memory cell. Therefore, the charging of a discharge bit line up to the bit line voltage at which the point "1" is separated from the read amplifier input, would still only take place very slowly unless the part of the circuit including the MOS-transistors M1 to M3 would feed a relatively large charging current directly from the supply voltage source into the bit line in this operating range.

In order not to impede the actual reading of the memory cells, the W/L ratios of the two inverters M1/M2 and M4/M5 are made so that the transistor M3 is cut off in any event when the parasitic bit line capacity $C_{BL}$ is being charged up, before the transistor M6 begins to separate the bit line or read amplifier input, respectively, from the read amplifier output, i.e. from the point "1".

A safety margin $\Delta U_{BL}$ must be provided between the response voltages of the circuit parts with the transistors M1 to M3 and M4 to M7, so as to ensure that the circuit part with the transistors M4 to M7 still leaves the point "1" at low potential if the memory cell is conducting even for different threshold voltages $U_T$ of the transistors M2 and M5. This safety margin $\Delta U_{BL}$ means that the circuit part equipped with the transistors M4 to M7, with its relatively small charging current, must charge up the relatively large bit line capacity $C_{BL}$ alone by the amount of this voltage difference $\Delta U_{BL}$, i.e. without assistance by the transistor M3 which is already in the non-conducting state, before the bit line is decoupled from the point "1".

With a circuit arrangement according to the objects of the invention, a simplification of the circuit is achieved because the circuit part M1 to M3 is eliminated. In this way, the need which exists in the above-described known read amplifier, to provide a safety margin $\Delta U_{BL}$ in the response voltages of the circuit parts M1 to M3 and M4 to M7, which is at the expense of the readout speed is eliminated. The function of the circuit part M1 to M3 is taken over by the MOS-transistor connected between the supply voltage and the read amplifier output which again supplies a large current for charging the parasitic bit line capacity $C_{BL}$ from the supply voltage source if the bit line has been discharged.

Figure 2:
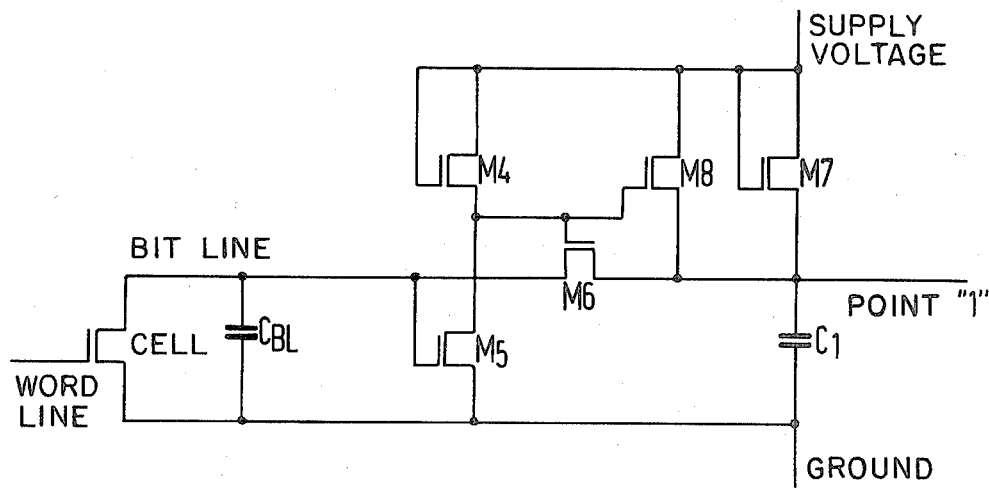
FIG. 2 is a schematic circuit diagram of the read amplifier according to the invention.

The circuit diagram of the read amplifier according to the invention is shown in FIG. 2. The parasitic capacities on the respective bit line or read amplifier output side and the circuit elements are provided with the same reference symbols as far as they agree with those according to FIG. 1. The MOS-transistor replacing the circuit part M1 to M3 according to FIG. 1, which is connected between the supply voltage and the read amplifier output, is designated with reference character M8.

Figure 3:
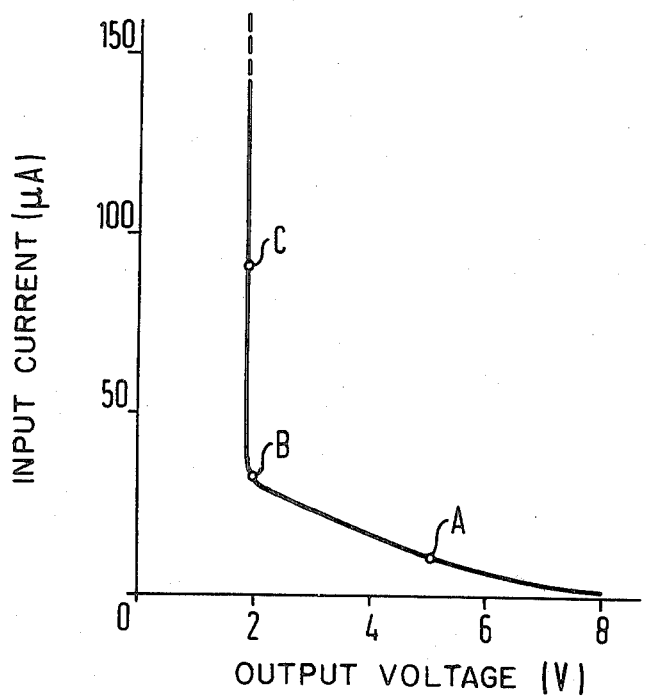
FIG. 3 is a plot diagram showing the input current and output voltage of the circuit of FIG. 2.

FIG. 3 shows the input current/output voltage characteristic of the read amplifier according to FIG. 2, where point A characterizes the current sampling operation and point C the operating state in which the input voltage at the read amplifier is held at a predetermined value, i.e. is clamped. Point B indicates the transistion point at which the transition from current sampling operation to operation with a clamping of the input voltage takes place.

In current sampling operation (point A) i.e. for low input currents or small memory cell currents, the memory cell current is statically equal to the current given off by the MOS-transistor M7. In this operation position, caused by the weakly conducting state of the MOS-transistor M6, the read amplifier input is decoupled from its output. A read amplifier output voltage adjusts itself, which corresponds to the conduction state of the memory cell and which is a measure for the logic state of the memory cell. For a larger input current, i.e. when the transition point B is reached, the input voltage at the read amplifier drops by a few mV. This small voltage drop leads to a voltage rise at the output of the inverter M4/M5 which is sufficient to switch the MOS-transistor M6 into a highly conductive state and therefore to couple the read amplifier input and output voltage-wise.

Point "C", i.e. the clamping of the input voltage, or the holding of the input voltage at a predetermined value, takes place upon a further increase of the input current. The MOS-transistor M7 alone is no longer capable of supplying sufficient current to maintain the level of the input voltage in this operating position. The further small drop of the input voltage leads to a renewed increase of the output voltage at the inverter M4/M5, through which the MOS-transistor M8 is now also switched into conduction and therefore additional current is supplied to the memory cell, whereby the input voltage is clamped to a constant value. At the beginning of the separation of the bit line from the point "1" (read amplifier output) i.e. at the transition point "B", the gate-source voltage of the MOS-transistor M6, is $U_{GS}(M6)$ minus the drain-source voltage drop $U_{DS}$ at the transistor M6. Since the gate-source voltage at the transistor M8 is therefore always lower than the gate-source voltage of the transistor M6 by the amount $U_{DS}(M6)$, the transistor M8 is reliably cut off by the beginning of the separation of the bit line and the point "1" and therefore does not impede the readout.

If the threshold voltage $U_T$ of the transistor M8 is lower by $\Delta U_T$ than the threshold voltage $U_T$ of the transistor M6, then the read amplifier generates the safety margin automatically, which is also $\Delta U_T$. This is done through additionally charging up the capacity $C_1$ by this voltage $\Delta U_T$, so that M8 is finally cut off. The bit line needs to be charged up only by a voltage $\Delta U_{BL}$ which is smaller than $\Delta U_T$ by the factor of the voltage gain of the inverter M4/M5 and is therefore considerably smaller than the safety margin $\Delta U_{BL}$ of the hereinafore-described known read amplifier. If the threshold voltage $U_T$ of the transistor M8 is higher than that of the threshold transistor M6, similar considerations apply.

The static final voltage value of the point "1", i.e. a read amplifier output voltage corresponding to the conduction state of the memory cell, is therefore reached more rapidly than is the case in the above-described known read amplifier, where, in addition, the number of components is lowered from, for instance, 7 to 5.

The transistors M4 and M7 of the read amplifier according to FIG. 2 can also be provided as MOS-transistors of the depletion type in which case the gate and the source are connected.

The supply voltages otherwise depend on the situation and requirements of the specific case.

There are claimed:

1. Circuit having MOS-transistors for the rapid evaluation of the logic state of a sampling node, comprising a circuit input connected to the sampling node, a circuit output, a supply voltage source, an inverter being connected to said circuit input and having an output, a first transistor being connected between said circuit input and said circuit output and having a gate connected to said output of said inverter, a second transistor being connected between said supply voltage source and said circuit output and having a gate connected to said output of said inverter, and a third transistor shunted across said second transistor as a load resistor.

2. Circuit according to claim 1, including a semiconductor read-only memory array with the sampling node selectively connected to single memory cells, as a read amplifier.

3. Circuit according to claim 2, wherein said inverter includes transistors of the enhancement type, and said first, second and third transistors are of the enhancement type.

4. Circuit according to claim 2, wherein said inverter includes an MOS-transistor of the depletion type connected as a load resistor, and said third transistor is an MOS-transistor of the depletion type.

5. Circuit according to claim 1, wherein said inverter comprises two series-connected transistors, said output of said inverter being connected between said series-connected transistors.

* * * * *